United States Patent [19]

Torigoe

[11] Patent Number: 4,682,885

[45] Date of Patent: Jul. 28, 1987

[54] ILLUMINATION APPARATUS

[75] Inventor: Makoto Torigoe, Kawasaki, Japan

[73] Assignee: Canon Kabushiki Kaisha, Tokyo, Japan

[21] Appl. No.: 913,619

[22] Filed: Sep. 30, 1986

Related U.S. Application Data

[63] Continuation of Ser. No. 729,056, Apr. 30, 1985, abandoned.

[30] Foreign Application Priority Data

May 2, 1984 [JP] Japan ................. 59-87879

[51] Int. Cl.⁴ ............................... G03B 27/54
[52] U.S. Cl. ........................ 355/67; 355/71; 362/268; 350/167; 350/433; 350/523
[58] Field of Search ............... 355/53, 67, 71; 350/167, 169, 319, 433, 509, 523; 362/268

[56] References Cited

U.S. PATENT DOCUMENTS

| | | | |
|---|---|---|---|
| 3,724,924 | 4/1973 | Lenfant et al. | 350/167 |
| 4,294,538 | 10/1981 | Ban | 355/51 |
| 4,497,015 | 1/1985 | Konno et al. | 350/167 X |
| 4,498,742 | 2/1985 | Uehara | 350/523 |

*Primary Examiner*—L. T. Hix
*Assistant Examiner*—D. Rutledge
*Attorney, Agent, or Firm*—Fitzpatrick, Cella, Harper & Scinto

[57] ABSTRACT

An illumination apparatus for illuminating, with a light beam of arcuate cross-section, a mask having an integrated-circuit pattern to transfer the integrated-circuit pattern onto a semiconductor wafer includes an illumination optical system having a light source, a plurality of cylindircal lenses and a collimator lens to illuminate, in the Kohler illumination manner, a rectangular region on a predetermined plane, a restricting member disposed in the predetermined plane to restrict the light beam incident on the predetermined plane so that a light beam of arcuate cross-section emerges from the predetermined plane, and an optical member for forming an image of the restricting member on the mask. With this arrangement, the pattern of the mask is transferred onto the wafer without any distortion.

12 Claims, 6 Drawing Figures

ILLUMINATION APPARATUS

This application is a continuation of application Ser. No. 729,056, filed Apr. 30, 1985, now abandoned.

BACKGROUND OF THE INVENTION

This invention relates to an illumination apparatus and, more particularly, to an illumination apparatus arranged to provide an illumination beam of arcuate cross-section so that it is applicable particularly to an alignment and exposure apparatus of mirror projection type, for transferring an integrated-circuit pattern of a photomask onto a semiconductor wafer.

Alignment and exposure apparatuses of the mirror projection type are well known. Conventionally, in such alignment and exposure apparatuses, the photomask (which hereinafter will be referred to simply as "mask") has been illuminated in accordance with a well-known critical illumination method wherein a light source is imaged on the surface of the mask. An example is disclosed in U.S. Pat. No. 4,294,538 issued Oct. 13, 1981. The present inventor has found that such critical illumination for illuminating the mask involves inconveniences as follows:

The alignment and exposure apparatus of mirror projection type requires an illumination area of arcuate shape. According to the critical illumination, images of the light source are formed at the points within the arcuate illumination area on the mask surface and these light source images are inclined concentrically with respect to the axis of the optical system. That is, the directions of the converging light rays which are going to be focused on each point in the arcuate illumination area on the mask surface would vary along the arcuate illumination area, particularly in the directions from the middle to the end portions of the arcuate area. FIG. 1 shows this inclination schematically. In this Figure, reference character O shows the optical axis, A shows the arcuate illumination area, and B shows the light source images. As viewed in this Figure, the above-mentioned directions of the converging light rays with respect to each of the light source images B are the directions perpendicular to and toward that light source image. As compared with such concentric orientation of the light source images, the fine pattern of the mask for preparing the integrated circuits or the like generally shows a definite directionality with respect to each of the X-direction and the Y-direction, both of which are contained in a plane perpendicular to the optical axis O. More particularly, the mask pattern has pattern elements extending generally in two orthogonal directions contained in the mask plane. Therefore, there occurs a deviation between the orientation of the light source images (or the directions of convergence as described above) and the directionality of the pattern of the mask, which deviation increases toward each of the ends of the arcuate illumination area. As a result, only a slight amount of defocus would cause distortion of the pattern transferred onto the wafer. This is particularly notable at the end portions of the arcuate illumination area.

SUMMARY OF THE INVENTION

It is accordingly a primary object of the present invention to provide an improved illumination apparatus by which a fine pattern of a mask can be transferred onto a wafer without any distortion.

It is another object of the present invention to provide an improved illumination apparatus suitable for use in an alignment and exposure apparatus of the mirror projection type.

Briefly, according to the present invention, there is provided an apparatus for illuminating an object, comprising means for producing a light beam, means having an arcuate slit aperture, for restricting an area of illumination, means for receiving the light beam produced by the light producing means to establish Kohler illumination for the restricting means, and means for forming an image of the restricting means at a predetermined position with respect to the object.

According to another aspect of the present invention, there is provided an apparatus for illuminating an object, comprising means for producing a light beam, means for restricting an area of illumination, means for receiving the light beam produced by the light producing means to establish Kohler illumination for the restricting means, the Kohler illumination establishing means including an optical system for producing a light beam having different F-numbers with respect to plural directions, and means for forming an image of the restricting means at a predetermined position with respect to the object.

In one preferred form of the present invention, an illumination apparatus for illuminating, with a light beam of arcuate cross-section, a mask having an integrated-circuit pattern to transfer the integrated-circuit pattern onto a semiconductor wafer includes an illumination optical system having a light source, a plurality of cylindrical lenses and a collimator lens to illuminate, in a Kohler illumination manner, a rectangular region on a predetermined plane, a restricting member disposed in the predetermined plane to restrict the light beam incident on the predetermined plane so that a light beam of arcuate cross-section emerges from the predetermined plane, and an optical member for forming an image of the restricting member on the mask. With this arrangement, the pattern of the mask is transferred onto the wafer without any distortion.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
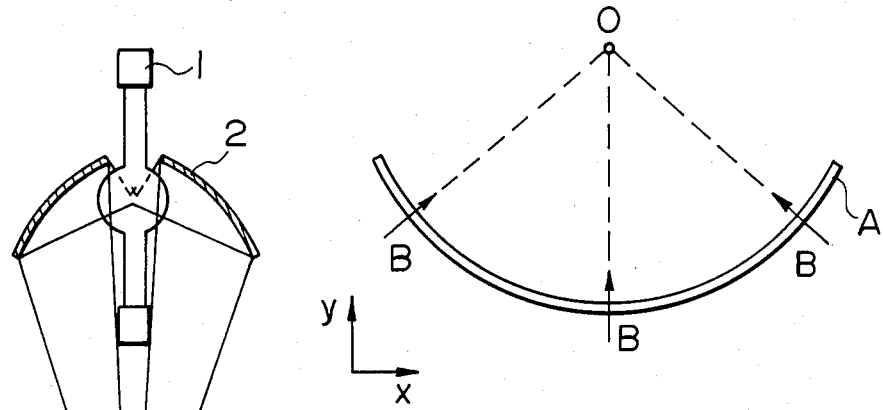
FIG. 1 is a schematic view showing a problem peculiar to conventional illumination apparatuses.
Figure 2:
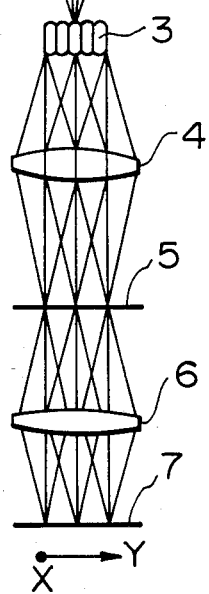
FIG. 2 is a schematic view showing an illumination apparatus according to an embodiment of the present invention.
Figure 3:
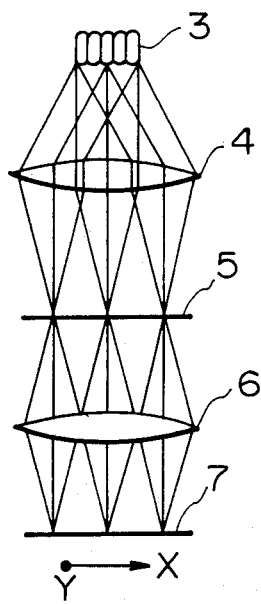
FIG. 3 a side view schematically showing the apparatus of FIG. 2.
Figure 4:
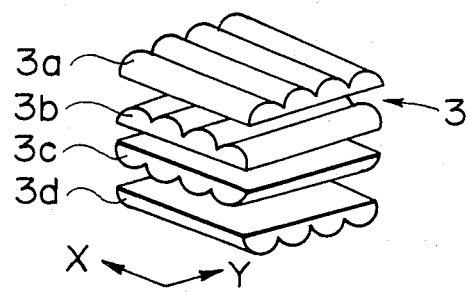
FIG. 4 is a perspective view showing an optical integrator employed in the apparatus of FIG. 2.
Figure 5:
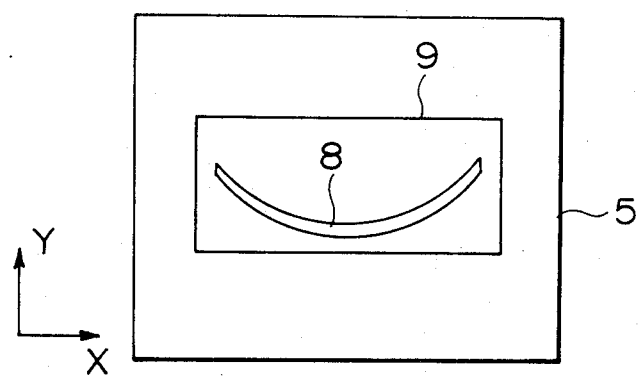
FIG. 5 is a plan view showing the relation between an arcuate slit and an illumination area according to an embodiment of the present invention.

Referring to FIG. 2, there is shown an illumination apparatus according to an embodiment of the present invention, as viewed from the X-direction. The illumination apparatus includes an illumination light source 1 such as a super Hg lamp which is disposed at a first focal point of an elliptical mirror 2. A light or optical integrator 3 comprises, for example, a combination of plural cylindrical lens plates. Details of the optical integrator are illustrated in FIG. 4. The illumination apparatus further includes a collimator lens system 4 and a restricting member 5 having formed therein an arcuate slit aperture which is also illustrated in the plan view of FIG. 5. The positional relation between the optical integrator 3, the collimator lens system 4 and the arcuate-slit plate 5 is such that the light emerging points of the optical integrator 3 are substantially coincident with the first focal surface of the collimator lens system 4, while the arcuate-slit plate 5 is coincident with the second focal surface of the collimator lens system 4. With this arrangement, the combination of the optical integrator 3 with the collimator lens system 4 effectively defines a Kohler illumination system relative to the arcuate-slit plate. The illumination apparatus further includes an imaging optical system 6 for forming an image of the arcuate slit plate 5 on a surface of a mask 7. The mask 7 has formed thereon a fine circuit pattern for preparing integrated circuits or the like. FIG. 3 is a schematic view showing the portion of the illumination apparatus of FIG. 2 that includes the elements 3–6, as viewed from the Y-direction which is perpendicular to the X-direction.

In operation, the light beam emitted from the light source 1 is condensed by the elliptical mirror 2 and the condensed light beam is incident on a light-receiving surface of the optical integrator 3 by which a pluralty of secondary light sources are defined. The light beams emitted from the light emerging points of the optical integrator 3 are collimated by the collimator lens 4 and the collimated light beams are incident on the surface of the arcuate-slit plate 5. Thus, the arcuate-slit plate 5 is illuminated in the Kohler illumination manner, with a number of light beams. The light beams passing through the slit aperture of the arcuate-slit plate 5 enter into the imaging optical system 6 by which they are directed toward the mask 7 surface, so that an illumination area of arcuate shape is formed on the mask 7 surface. In other words, the image of the arcuate slit aperture of the plate 5 is formed on the mask 7 surface.

According to the present invention, as described above, the arcuate-slit plate 5 is disposed in the plane to be illuminated by the Kohler illumination and, further, the arcuate slit aperture of the plate 5 is imaged on the mask 7 surface. Thus, in the present invention, no image of the light source 1 is formed on the mask 7 surface as in the conventional illumination apparatuses. Therefore, the problem of distortion of the pattern transferred onto the wafer is eliminated.

Referring now to FIG. 4, the optical integrator 3 in this embodiment is formed, for example, by a combination of four cylindrical lens elements 3a–3d. Each of the first and fourth lenses 3a and 3d has a focal length f1, while each of the second and third lens elements 3b and 3c has a focal length f2, wherein $f1 > f2$. In each of the pair of the elements 3a and 3d and the pair of the elements 3b and 3c, one of the elements is disposed at the focal point position of the other elements. Further, each of the elements 3a and 3d has generating lines extending in parallel to the X-direction, while each of the elements 3b and 3c has generating lines extending in parallel to the Y-direction which is perpendicular to the X-direction. With the combination of such two pairs of cylindrical lens elements 3a, 3d and 3b, 3c having two orthogonal axes, the optical integrator 3 produces a number of light beams each having different F-numbers with respect to the X-direction and the Y-direction. These light beams, after being collimated by the collimator lens 4, are superposed one upon another on the arcuate-slit plate 5, so that an illumination area 9 (see FIG. 5) of rectangular shape (oblong in this embodiment) having desired dimensions co-ordinated with the size of the slit aperture 8 (FIG. 5) can be formed on the surface of the arcuate-slit plate 5. This is effective to minimize unnecessary illumination of such an area that does not need to be illuminated and, therefore, allows efficient utilization of the quantity of light. In the plan view of FIG. 5, the rectangular illumination area 9 formed on the arcuateslit plate 5 has major sides extending in the X-direction and minor sides extending in the Y-direction. In a case where the efficient utilization of the light quantity is not so important, the optical integrator 3 may be formed by a bundle of bar-lenses.

Figure 6:
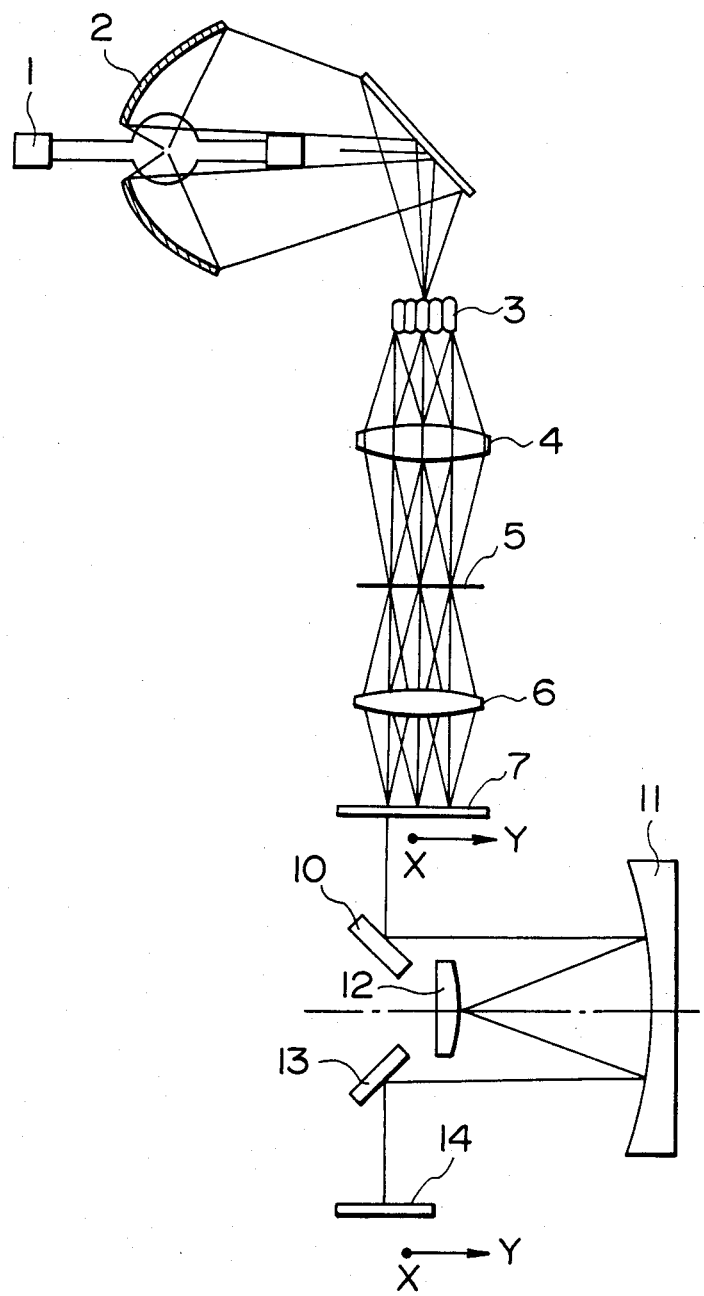
FIG. 6 is a schematic view showing an alignment and exposure apparatus of the mirror projection type, according to another embodiment of the present invention.

Referring now to FIG. 6, there is shown an alignment and exposure apparatus of the mirror projection type, in which an illumination apparatus according to the present invention is incorporated. In FIG. 6, the same reference numerals as in the embodiment described with reference to FIGS. 2–5 are assigned to the elements having corresponding functions. Therefore detailed description thereof is omitted here for the sake of simplicity of the Specification.

The exposure apparatus includes, in addition to the elements 1–7, flat mirrors 10 and 13 for bending the optical path, a concave mirror 11 and a convex mirror 12. The concave mirror 11 co-operates with the convex mirror 12 to form a mirror projection system of well-known type. Reference numeral 14 denotes a semiconductor wafer. In operaton, the mask 7 and the wafer 14 is scanningly moved as a unit in the Y-direction, whereby the entire pattern of the mask 7 is transferred onto the wafer 14 without occurrence of any distortion of the pattern.

As described hereinbefore, the mask pattern to be transferred onto the semiconductor wafer generally shows a definite directionality wherein the pattern elements extend along two orthogonal directions. On the other hand, since the two pairs of cylindrical lenses constituting the optical integrator 3 are arranged so that their generating lines extend along two orthogonal directions, respectively, as has described in the foregoing, the light rays which have been emitted from a number of point sources (optical integrator 3) and which are going to be incident on one point within the illumination area 9 (FIG. 5), covering the arcuate slit aperture 8, on the slit plate 5 are converging or advancing in the directions along two orthogonal lines, as viewed from the light emitting side, and toward the intersection of the orthogonal lines. Such directional characteristic of the incident light rays is exactly reproduced on the mask 7 surface by the imaging lens system 6 disposed between the slit plate 5 and the mask 7. Therefore, when the mask 7 is incorporated into the illumination apparatus such that either of the two orthogonal directions along which the pattern elements thereof extend coincides with either of the above-described two orthogonal axes of the illumination optical system, i.e. the two orthogonal directions along which the generating lines of the two pairs of cylindrical lenses extend, the directionality of the mask pattern and the directionality of the incident light rays which are going to be incident on each point on the mask 7 surface exactly correspond to or are fully coordinated with each other, over the entire surface of the mask 7. In other words, the light rays which are going to be incident on one point in an arcuate area on the mask 7 surface are travelling or converging in the directions along the X and Y axes of the mask 7 along which the elements of the mask patter extends. This leads to the result that, even if the pattern projected onto the semiconductor wafer is out of focus, there occurs only an isotropic or regular defocus (rectangularity is maintained if the mask pattern is rectangular), over the entire surface of the wafer. There would not occur any distortion.

Adjustment of the optical sytem as shown in FIGS. 2 and 3 will now be described. First the mask 7 is replaced by a plate member (not shown) having a light-transmitting pin-hole. Next, a screen member (not shown) is disposed below the pin-hole plate, as viewed in FIG. 2. According to the principle of pin-hole cameras, an image of the arcuate slit aperture 8 (FIG. 5) formed on a plane equivalent to the mask 7 plane is projected onto the screen member. This projected image on the screen member has an outer configuration corresponding to that of the arcuate slit aperture 8, and the above-described directionality of the light rays incident on each point in the arcuate slit area 8 of the slit plate 5 is exactly reproduced in the projected image on the screen member. Accordingly, by adjusting the components of the illumination apparatus so as to obtain, within the arcuate slit image as projected on the screen member, a desired directionality of the incident light rays as described above, superior illumination performance is attainable.

In accordance with the present invention, as has hitherto been described, fine patterns can be transferred onto the wafer without any distortion. Further, use of the Kohler illumination in the present invention is effective to prevent non-uniform illumination which otherwise might be caused by any unevenness in the luminance of the light source. In addition, use of the combined cylindrical lenses as the optical integrator allows efficient utilization of the light quantity, which enables use of a lower power light source.

While in the foregoing embodiments the optical integrator 3 of the illumination optical system has been described as being an anamorphic system whereas the collimator lens 4 has been described as being a non-anamorphic system, both the former and the latter ma be of anamorphic type. As a further alternative, only the collimator lens system may be of anamorphic type. From the standpoint of prevention or suppression of loss of the light quantity, however, the combination of an anamorphic optical integrator with a non-anamorphic collimator lens as disclosed in the embodiments may be preferable.

While the invention has been described with reference to the structures disclosed herein, it is not confined to the details set forth and this application is intended to cover such modifications or changes as may come within the purposes of the improvements or the scope of the following claims.

What is claimed is:

1. An apparatus for illuminating an object, comprising:
    means for producing a light beam;
    means having an arcuate slit aperture, for restricting an area of illumination;
    means for receiving the light beam produced by said light producing means to establish Kohler illumination for said restricting means, said Kohler illumination establishing means including a light integrator having a plurality of elements each having cylindrical parts extending in parallel in one direction, at least two of said elements being arranged so that the directions in which the cylindrical parts thereof respectively extend are different, and
    means for forming an image of said restricting means, illuminatedin Kohler fashion by said Kohler illumination establishing means, at a predetermined position with respect to the object.

2. An apparatus according to claim 1, wherein said light integrator comprises a first element having said cylindrical parts and a second element having said cylindrical parts, said first and said second elements being superimposed in a direction of an optical path, said cylindrical parts of said first element and said cylindrical parts of said second element extending perpendicularly relative to each other.

3. An apparatus according to claim 1, wherein said Kohler illumination establishing means includes an optical system for producing a light beam having different F-numbrs with respect to plural directions.

4. An apparatus according to claim 3, wherein said cylindrical parts of said plurality of elements comprise a plurality of cylindrical lenses and wherein said plurality of elements have different focal lengths.

5. An apparatus according to claim 1, wherein said image forming means forms the image of said restricting means on the object.

6. An apparatus according to claim 1, comprising means for mounting the object for movement in a direction and wherein said cylindrical parts of at least one of said plurality of elements comprising said light integrator have generating lines extending in parallel to the direction of movement of the object.

7. An apparatus according to claim 6, wherein said cylindrical parts of at least one of said plurality of elements comprising said light integrator have generating lines extending perpendicularly to the direction of movement of the object.

8. An apparatus according to claim 7, wherein said cylindrical parts the generating lines of which extend in parallel to the direction of movemment of the object have a focal length different from that of said cylindrical parts the generating lines of which extend perpendicularly to the direction of movement of the object.

9. An apparatus for illuminating an object, comprising:
    means producing a light beam;
    means having a slit aperture of predetermined shape, for restricting an area of illumination;
    means for receiving the light beam from said light producing means to establish Kohler illumination for said restricting means, said Kohler illumination establishing means including an optical system having different powers with respect to different directions; and
    means for forming an image of said restricting means at a predetermined position with respect to the object.

10. An apparatus according to claim 9, wherein said optical system includes a multi-beam producing element.

11. An apparatus according to claim 9, wherein said optical system includes a plurality of cylindrical lenses having different focal lengths.

12. An apparatus according to claim 9, wherein said slit aperture has an arcuate shape.

* * * * *